United States Patent

[11] 3,615,486

[72] Inventor Gerard Albert Delzenne
Wilrijk-Antwerpen, Belgium

[21] Appl. No. 871,555
[22] Filed Nov. 3, 1969
[45] Patented Oct. 26, 1971
[73] Assignee Gevaert-AGFA N.V.
Mortsel, Belgium
[32] Priority June 1, 1965
[33] Great Britain
[31] 23,395/65
Continuation of application Ser. No. 553,277, May 27, 1966, now abandoned.

[54] PHYSICOCHEMICAL RECORDING METHOD
6 Claims, No Drawings

[52] U.S. Cl. .......... 96/49, 96/27 R, 96/35.1, 96/115 R
[51] Int. Cl. .......... G03c 1/70
[50] Field of Search .......... 96/27, 35, 35.1, 115, 49

[56] References Cited

UNITED STATES PATENTS

| | | | |
|---|---|---|---|
| 2,948,610 | 8/1960 | Merrill et al. | 96/115 R |
| 3,236,647 | 2/1966 | Phlipot | 96/35.1 |
| 3,345,171 | 10/1967 | Laridon et al. | 96/75 X |
| 3,350,205 | 10/1967 | Goffe | 96/35.1 |

*Primary Examiner*—Ronald H. Smith

ABSTRACT: A process is described for recording and reproducing information comprising the steps of imagewise exposing a recording layer comprising a polymeric composition which is photochemically hardenable to actinic light and contacting the exposed layer to a fluid medium containing a solvent and a nonsolvent for the polymeric composition for a period sufficient to mat the unhardened area of the recording layer without removing any substantial part of the polymeric composition. The resultant recording layer can be used in a manner similar to conventional photoresists, printing plates, and the like.

PHYSICOCHEMICAL RECORDING METHOD

This is a continuation of application Ser. No. 553,277, filed May 27, 1966, now abandoned.

The present invention relates to a process for recording and reproducing information by means of a polymeric composition which can be photochemically hardened.

Many polymeric compositions for recording layers that have the property of becoming less soluble when exposed to actinic radiation are already known. Recording layers, containing such compositions, after imagewise exposure to actinic light, are, e.g. used to produce a photoresist, a printing plate or a relief reproduction of the original on a receiving element. For producing a photoresist the exposed recording layer is normally treated with a solvent for removing the unexposed and nonhardened portions of the layer. For producing a relief reproduction on a receiving element an exposed photochemically hardenable recording layer, occasionally while heating and/or occasionally in the presence of a solvent, is pressed against a receiving element, e.g., a porous layer or sheet and peeled apart therefrom leaving on the receiving element an imagewise stratum of unhardened material of the recording layer.

Now it has been found that where use is made of a recording element, e.g. a recording layer or sheet, wholly or mainly consisting of a polymeric composition which can be photochemically hardened, a directly visible or by light detectable reproduction of an electromagnetic radiation image can be obtained by subjecting the recording element, after imagewise exposure to actinic electromagnetic radiation, to a treatment, with a mixture comprising one or more solvents and one or more nonsolvents for the said polymeric composition, without removal of any or any substantial part of the thus treated element, and wherein said mixture is chosen in such a way that the recording element becomes mat or opalescent by said treatment on the nonexposed areas.

All photoreticulatable (photocrosslinkable) polymeric compositions which show after exposure to actinic radiation a difference in solubility, or swelling degree between the portions irradiated with actinic light and the nonirradiated portions are in principle all suitable for the recording technique of the present invention. One skilled in the art has only to carry out a simple test to see if a particular polymer system will be sensitive enough to produce the effect of imagewise matting.

Since each of the photochemically hardenable polymers has different solubility characteristics, the appropriate mixture of solvent and nonsolvent must be determined by trail and error preferably in function of the temperature in order to know the optimum treatment temperature.

When a mixture wherein the influence of the solvent dominates acts upon the recording layer for a long time, said recording layer will be dissolved whereas in the case said mixture acts upon said recording layer only for a too little time no effect will be produced. When the amount of nonsolvent dominates, the recording layer remains smooth and clear all over its surface whatever the period of treatment may be.

As solvent is preferably used a liquid or mixture of liquids that dissolves at least 5 parts by weight of the said polymeric composition at the temperature at which the treatment is carried out.

The solvent/nonsolvent mixture can be applied in liquid state or in vapor state preferably however the exposed surface of the recording layer is dipped in the mixture.

The thickness of the recording element is preferably comprised between 5 and 500 $\mu$.

The matting effect seems not to be very dependent on the thickness of the recording element; the amount of nonsolvent, which can penetrate into the recording element together with the solvent, appears to be more important.

Solvent and nonsolvent need not be miscible with each other in all ratios but a treatment of the exposed recording element with a homogeneous mixture of both is preferred. Preferably a combination of solvent with nonsolvent is used wherein the solvent evaporates from the recording element more rapidly than the nonsolvent thus causing a more rapid matting, in other words preferably a mixture is used containing a solvent the vapor pressure of which is higher than that of the nonsolvent.

As photochemically hardenable polymers or polymer systems are preferably used those that have a softening point comprised between 50° and 200° C. and that have a good solubility preferably in noninflammable solvents such as halogenated hydrocarbons.

In combination with the photochemically hardenable polymer or polymers a certain amount of dissolved or dispersed substances such as stabilizers, plasticizers, dyes, sensitizers, photoinitiator and curing catalysts as well as a certain amount of monomeric curing agent may be present in the recording element. However, preferably more than 90 percent of the recording elements consists of photochemically hardenable polymer.

Photochemically hardenable water-insoluble polymers that are preferably used in the reproduction system according to the present invention, e.g., resins containing aromatic azide groups and/or carboxylic acid azide groups and/or sulfonic acid azide groups, are described in the Belgian Pat. Nos. 650,367, 665,428 and 656,511, which specifications have to be read in conjunction herewith.

The matting that arises on treatment of the exposed recording element with a mixture of solvent and nonsolvent can be promoted by dispersing in the recording layer a finely divided substance that is insoluble or difficulty soluble in the said photohardenable polymer or polymer composition and that is soluble in the said mixture.

In virute of the selective or differential matting produced by the treatment with the solvent/nonsolvent mixture the recording element can then be used for producing a light-image by light transmittance or reflectance, e.g. in a projector or printed, but the record is also readable.

The following examples illustrate the present invention, without limiting it, however, thereto.

EXAMPLE 1

A solution of 0.5 g. of an arylazido polycondensate which is built up by the following structural units:

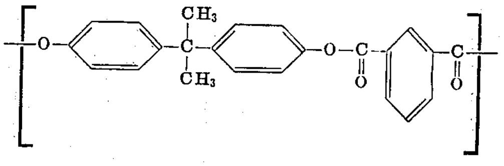

and which is prepared as described in example 1 C of the Belgian Patent No. 656,511, and 0.05 g. of Michler's ketone in a mixture of 40 ccs. of methylene chloride and 10 ccs. of tetrachloroethane is coated on a polyethylene glycol terephthalate support. After drying The coated layer has a thickness of 10 $\mu$. The recording layer thus obtained is exposed with a high-pressure mercury vapor lamp of 80 watt at a distance of 15 cm. for 5 min. in contact through a transparency of a typed text.

The exposed material is divided into 28 strips which are used to determine the matting effect in function of the treating time and ratio by volume of solvent (methylene chloride) and nonsolvent (methanol) in the treating liquid.

The following table and legend illustrate the results of these tests:

TABLE

| Volume ratio of methanol/methylene chloride | Treating time | | | | | | |
|---|---|---|---|---|---|---|---|
| | 30″ | 1′ | 2′ | 5′ | 10′ | 15′ | 30′ |
| 40/60 | + + | + + | + + | + + | + + | + + | + + |
| 50/50 | + | + | + | + + | + + | + + | + + |
| 60/40 | − | + | + | + | + | + | + + |
| 70/30 | − | − | − | − | − | + | + |

+ + = Clearly visible matting.
+ = Very slight matting.
− = No matting perceptible.

EXAMPLE 2

A solution of 0.5 g. of a modified polyether which is built up by the following structural units:

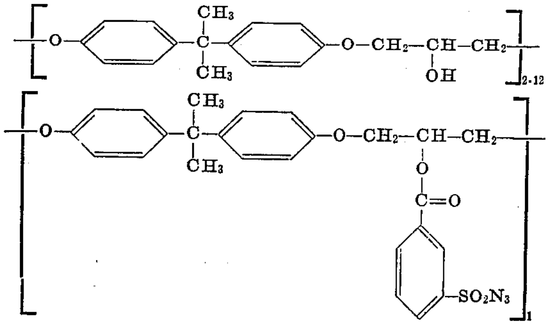

and which is prepared as described in the Belgian Pat. Nos. 665,428 and 0.05 g. of Michler's ketone in a mixture of 45 ccs. of methylene chloride and 5 ccs. of sym-tetrachloroethane is coated on a ployethylene glycol terephthalate support. After drying, the coated layer has a thickness of 10 $\mu$. The recording layers thus obtained is exposed with a high-pressure mercury vapor lamp of 80 watt at a distance of 15 cm. for 5 min. in contact through a transparency of a typed text.

The exposed material is divided into 21 strips which are used to determine the matting effect in function of the treating time and ratio by volume of solvent (methylene chloride )and nonsolvent (methanol) in the treating liquid.

The following table and legend illustrate the results of these tests:

TABLE

| Volume ratio of methanol/ methylene chloride | Treating time | | | | | | |
|---|---|---|---|---|---|---|---|
| | 30'' | 1' | 2' | 5' | 10' | 15' | 30' |
| 40/60 | ++ | ++ | ++ | ++ | ++ | ++ | ++ |
| 50/50 | + | + | + | + | ++ | ++ | ++ |
| 60/40 | − | − | + | + | + | + | ++ |

It is claimed:

1. A process for recording and reproducing information comprising the steps of (1) imagewise exposing a recording layer comprising a polymeric composition containing groups selected from the group consisting of aromatic azide groups, carboxylic acid azide groups, and sulfonic acid azide groups and which is photochemically hardenable to actinic light for a time sufficient to harden said polymer in the exposed area; (2) contacting the exposed recording layer with a liquid or vapor mixture of a solvent and a nonsolvent for said polymeric composition; and (3) maintaining said contact for a period sufficient to mat the unhardened area of said recording layer without removing any substantial part of the polymeric composition.

2. The process according to claim 1 wherein said solvent mixture will dissolve at least 5 parts by weight of the polymeric composition per 100 parts of solvent mixture at the temperature at which the recording layer is contacted with said liquid or vapor mixture.

3. The process of claim 1 wherein the liquid or vapor mixture includes a finely divided substance which is substantially insoluble in the polymeric composition and is soluble in said liquid or vapor mixture.

4. The process according to claim 1 wherein the said mixture contains a solvent, the vapor pressure of which is higher than that of the nonsolvent.

5. The process according to claim 1 wherein the recording layer or sheet contains a sensitizer or photoinitiator for the photochemically hardenable polymer.

6. The process according to claim 1 wherein Michler's ketone is used as a sensitizer.